United States Patent
Lin et al.

[11] Patent Number: 5,885,868
[45] Date of Patent: Mar. 23, 1999

[54] PROCESS FOR FABRICATING SOI COMPACT CONTACTLESS FLASH MEMORY CELL

[75] Inventors: Ruei-Ling Lin, Kao Hsiung; Ching-Hsiang Hsu; Gary Hong, both of Hsinchu, all of Taiwan

[73] Assignee: United Microelectronics Corporation, Taipei, Taiwan

[21] Appl. No.: 789,202

[22] Filed: Jan. 24, 1997

[30] Foreign Application Priority Data

May 31, 1996 [TW] Taiwan .................................. 85106473

[51] Int. Cl.⁶ .................................................. H01L 21/336
[52] U.S. Cl. ........................... 438/257; 438/263; 438/149
[58] Field of Search ..................... 438/149, 151, 438/257, 259, 261, 262, 263, 296, 594, 264

[56] References Cited

U.S. PATENT DOCUMENTS

| | | | |
|---|---|---|---|
| 5,210,047 | 5/1993 | Woo et al. | 438/262 |
| 5,246,874 | 9/1993 | Bergemont | 438/261 |
| 5,304,503 | 4/1994 | Yoon et al. | 438/261 |
| 5,364,808 | 11/1994 | Yang et al. | 438/262 |
| 5,397,726 | 3/1995 | Bergemont | 438/261 |
| 5,494,837 | 2/1996 | Subramanian et al. | 438/149 |
| 5,661,060 | 8/1997 | Gill et al. | 438/261 |

OTHER PUBLICATIONS

"A Novel Memory Cell Using Flash Array Contactless EPROM (FACE) Technology," 1990 IEDM, pp. 90–94.
"A NAND Structured Cell With A New Programming Technology For Highly Reliable 5–V Only Flash EEPROM," 1990 Symposium on VLSI Technology, pp. 129–130.

Primary Examiner—Charles Bowers
Assistant Examiner—Jack Chen
Attorney, Agent, or Firm—Rabin & Champagne, P.C.

[57] ABSTRACT

A process for fabricating compact contactless flash memory array for semiconductor EEPROM devices having a number of memory cell units is disclosed. Field oxide layers for the flash memory array are first grown over the surface of an SOI wafer. Gate oxide layers are then grown. Floating gates are then formed by patterning the first polysilicon layer. Source/drain buried bitlines for the flash memory array are formed. A first BPSG (borophosphosilicate glass) layer is deposited and then reflown and etched back. An oxide-nitride-oxide layer is formed. A second polysilicon layer is deposited with in-situ dope. A $WSi_x$ layer then forms. Stacked gates for the flash array are formed by patterning into the formed oxide-nitride-oxide, second polysilicon and $WSi_x$ layers. The stacked gates are then covered with a second BPSG layer. Contact openings for the source/drain buried lines are formed. Metal lines leading into the contact openings are then formed for interconnecting the memory cells in the flash memory array with peripheral control circuits of the semiconductor EEPROM devices.

10 Claims, 8 Drawing Sheets

PROCESS FOR FABRICATING SOI COMPACT CONTACTLESS FLASH MEMORY CELL

BACKGROUND OF THE INVENTION

1. Field of the Invention

The present invention relates in general to a process for fabricating the memory cell configuration of high-density semiconductor electrically-erasable programmable readonly memory (EEPROM) devices. In particular, the present invention relates to a process for fabricating compact contactless memory arrays on Silicon-On-Insulator (SOI) for flash EEPROM devices. More particularly, the present invention relates to the process of fabrication of the compact contactless flash array on SOI for the flash EEPROM devices and provides for the elimination of the short channel effect during a hot carrier programming phase of the devices.

2. Technical Background

Scaling down of the physical dimensions of the memory cell configuration for semiconductor flash EEPROM devices is indispensable for the upcoming next generation of high-density non-volatile memory devices. In the effort conducted for the scaling down of the basic memory cell units in these flash EEPROM devices, several configurations have been proposed. For example, R. Kirisawa, S. Aritome, R. Nakauama, T. Endoh, R. Shirota and F. Masuoka proposed a NAND structure in their paper "A NAND structured cell with a new programming technology for highly reliable 5-V only flash EEPROM,"1990 Symposium on VLSI Technology, pp. 129–130. This NAND structure does need special design on source and drain regions, which suffer from band-to-band tunneling or even junction breakdown during extraction of electrons out of floating gates. This problem leads to unintentional damage on the thin oxide and difficulty in scaling the sources and drains of flash cells.

On the other hand, B. J. Woo, T. C. Ong, A. Gazio, C. Park, G. Atwood, M. Holler, S. Tam and S. Lai proposed another "FACE" structure in their paper "A novel memory cell using flash array contactless EPROM (FACE) Technology,"1990 IEDM, pp. 90–94. This basic structure, although featuring compact cells for the high-density flash EEPROM devices, does suffer significant short channel effects during the hot carrier programming phase of use. As is well known, short channel effect in memory cell units will easily and likely lead to device punch-through. As device miniaturization technology in semiconductor fabrication advances, this problem represents a serious drawback in the down-scaling of the device memory cells.

SUMMARY OF THE INVENTION

It is therefore the primary object of the present invention to provide a compact contactless flash array on SOI for EEPROM semiconductor devices and its process of fabrication that has a configuration suitable for high memory cell density.

It is another object of the present invention to provide a compact contactless flash array on SOI for EEPROM semiconductor devices and its process of fabrication that has a high-density memory cell array configuration without exhibiting short channel effect during the hot carrier programming phase of the device.

It is still another object of the present invention to provide a compact contactless flash array on SOI for EEPROM semiconductor devices and its process of fabrication that allows for better programming control over smaller number of individual memory cells.

To achieve the above-identified objects, the present invention provides a process for fabricating the disclosed device. Field oxide layers for the flash memory array are first grown over the surface of an SOI wafer. Gate oxide layers are then grown followed by first polysilicon layer deposition, and floating gates are then formed by patterning first polysilicon layer, and source/drain buried bitlines for the flash memory array are then formed. A first BPSG (borophosphosilicate glass) layer is then deposited and then reflown and etched back. An oxide-nitride-oxide layer is then formed, a second polysilicon layer deposited with in-situ dope, and a $WSi_x$ layer then forms. Stacked gates for the flash array are then formed by patterning into the formed $WSi_x$, second polysilicon and oxide-nitride-oxide layers. The stacked gates are then covered with a second BPSG layer. Contact openings for the source/drain buried lines and $n^+$ second polysilicon word lines are then formed. Metal lines leading into the contact openings are then formed for interconnecting the memory cells in the flash memory array with peripheral control circuits of the semiconductor EEPROM devices.

To achieve the above-identified objects, the present invention further provides a compact contactless flash memory array for semiconductor EEPROM devices which includes a number of memory cell units. Each of the cell units has a body line, source and drain lines and a stacked gate constructed over a silicon-on-insulator (SOI) wafer. The source and drain lines are buried lines. The body line is isolated by the surrounding buried source/drain lines and the $SiO_2$ layer of the SOI wafer. The stacked gate includes a gate oxide, a first polysilicon layer, an oxide-nitride-oxide configuration and a second polysilicon layer. The source and drain buried lines sandwiches the body line, while the stacked gate substantially sits directly atop the body line. The resulting flash memory array is free from the serious problems of short channel effect.

Other objects, features and advantages of the present invention will become apparent by way of the following detailed description of the preferred but non-limiting embodiments.

BRIEF DESCRIPTION OF THE DRAWINGS

The detailed description is made with reference to the accompanying drawings in which.

DETAILED DESCRIPTION OF THE PREFERRED EMBODIMENTS

Figure 1:
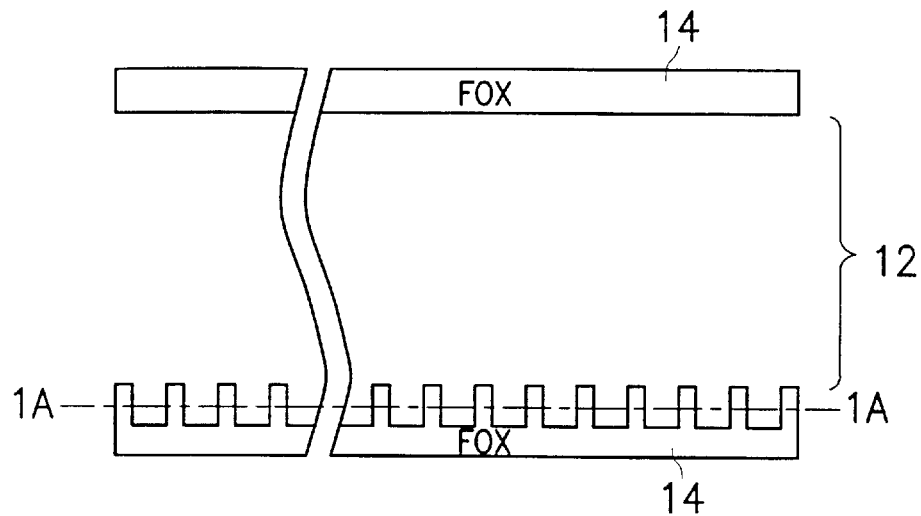
FIG. 1 is the top view of the basic SOI wafer carrying the memory array region together with the field oxides for the flash memory device to be fabricated.

For the fabrication of the compact contactless flash array for the EEPROM device in accordance with a preferred process of the present invention, the starting material may be, for example, a <100> oriented p-type SOI wafer. The process is described in the depicted procedural steps outlined below. Note that the dimensions of the component configuration shown in the drawing for the description of the present invention are not drawn to the exact scale. The drawings are prepared to schematically exemplify the characteristics of the present invention, rather than showing the precise relative dimensions therein.

Step 1

Field oxide layers for the flash array are first grown over the surface of an SOI wafer.

Figure 1A:
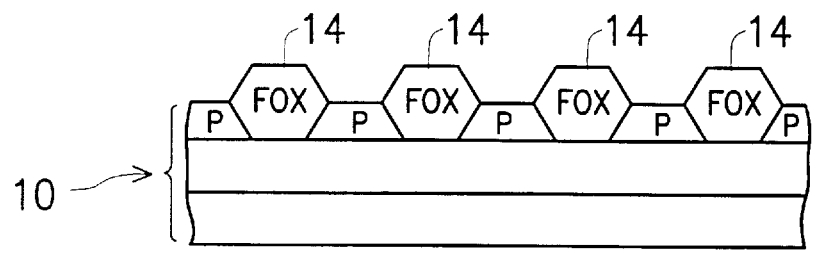
FIG. 1A is the cross-sectional view taken along the 1A—1A line of FIG. 1 that shows the SOI wafer at the completion of the formation of the field oxides.

FIG. 1 is the top view of the basic SOI wafer carrying the memory array region 12, together with the field oxides 14, for the flash memory device to be fabricated. To form the field oxide layers 14 for the memory cells in the memory array region 12, a layer of pad oxide (not shown in FIG. 1) with a thickness of about 200 to 400 Å is first grown over the surface of the SOI wafer, followed by the deposition of a nitride layer (not shown in FIG. 1) having a thickness of about 500 to 1,000 Å. The nitride layer is then patterned, and the photoresist then removed. Afterwards, field oxide layers 14 having a thickness of about 4,000 to 5,000 Å are grown under a temperature of about 900° to 950° C. utilizing the patterned nitride layer as the shielding mask. Then, after the formation of the field oxide layers 14, the nitride and pad oxide layers are removed. FIG. 1A shows the cross-sectional view of the SOI wafer 10 at the completion of this procedural step that reveals the cross section of the field oxide layer 14. Note that FIG. 1 shows the top view of the SOI wafer with the field oxide layers for the flash array being fabricated while FIG. 1A is the cross-sectional view taken along the 1A—1A line in FIG. 1.

Step 2

Gate oxide is grown followed by first polysilicon deposition, floating gates are formed by patterning the first polysilicon layer, and source/drain buried bitlines for the flash array are formed.

Figure 2:
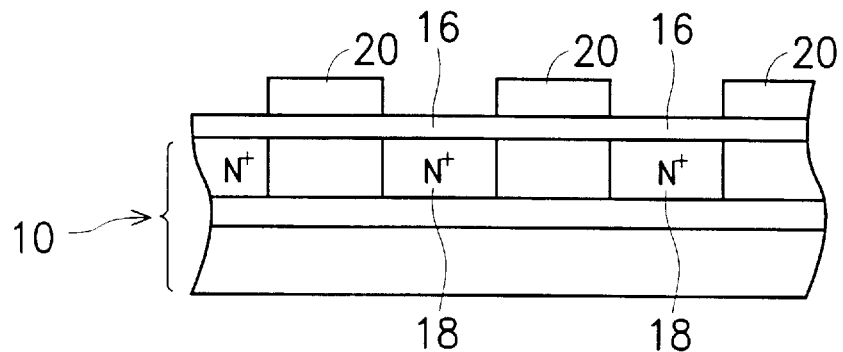
FIG. 2 is the cross-sectional view taken at a location in the memory array region of FIG. 1.

As is seen in FIG. 2, a layer of gate oxide 16 with a thickness of about 60 to 100 Å is grown at the appropriate location within the flash array region 12 (FIG. 1) on the SOI wafer, after which a first polysilicon layer with a thickness of about 1,500 Å is deposited. The first polysilicon layer is then patterned into the first polysilicon layers 20 in a photolithography procedure, followed by arsenic implantation at an energy level of about 25 KeV, achieving a dose of about $3E15/cm^2$ to form $n^+$ buried bitlines 18. Then photoresist employed in the photolithography procedure is removed, followed by the surface reoxidation of the first polysilicon layers 20 at the temperature of about 900° to 950° C., resulting in a layer of oxide having a thickness of about 100 to 200 Å for the sake of sealing. Note that the cross-sectional view of FIG. 2 depicts the SOI wafer configuration at a different location from that shown in FIG. 1A.

Step 3

A first BPSG (borophosphosilicate glass) layer is deposited followed by reflow and etch back.

Figure 3A:
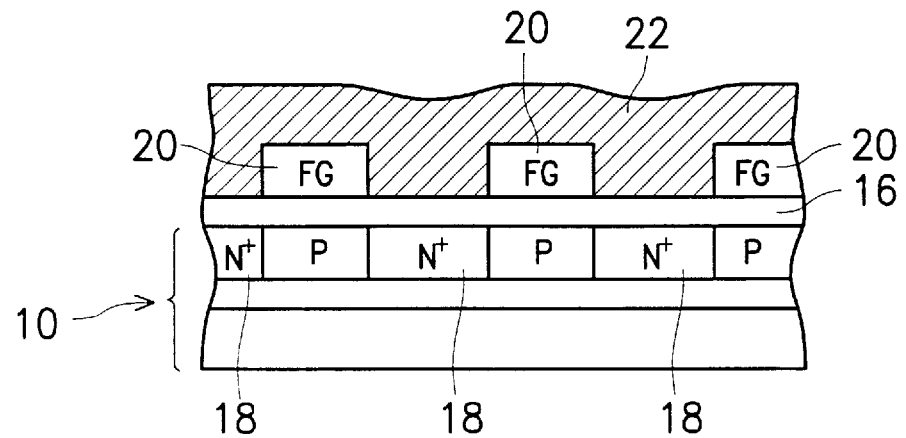
FIG. 3A is a cross-sectional view that shows a layer of BPSG that covers the first polysilicon layers completely.
Figure 3B:
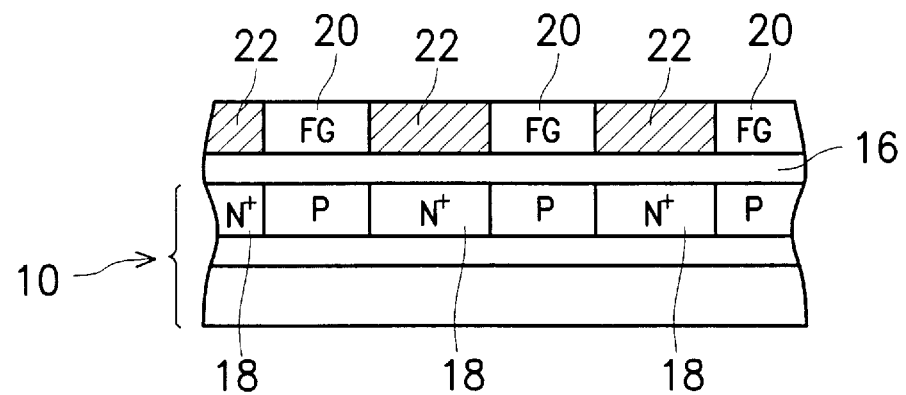
FIG. 3B shows the BPSG layer reflown to achieve planarity and etched back until the first polysilicon layers expose.

As is seen in FIG. 3A, a layer of BPSG 22 with a thickness of about 5,000 to 8,000 Å is then deposited in, for example, a low temperature oxide (LTO) deposition procedure in order to cover the first polysilicon layers 20 completely. Afterwards, the BPSG layer 22 is then reflown to achieve planarity and etched back until the first polysilicon layers 20 expose themselves, as is seen in FIG. 3B. Note that the cross-sectional view of FIGS. 3A and 3B are taken along the same location with that of FIG. 2 described in the previous procedural step.

Step 4

An oxide-nitride-oxide (ONO) layer is formed. A second polysilicon layer with in-situ dope is then deposited. A $WSi_x$ layer is then formed.

Figure 4:
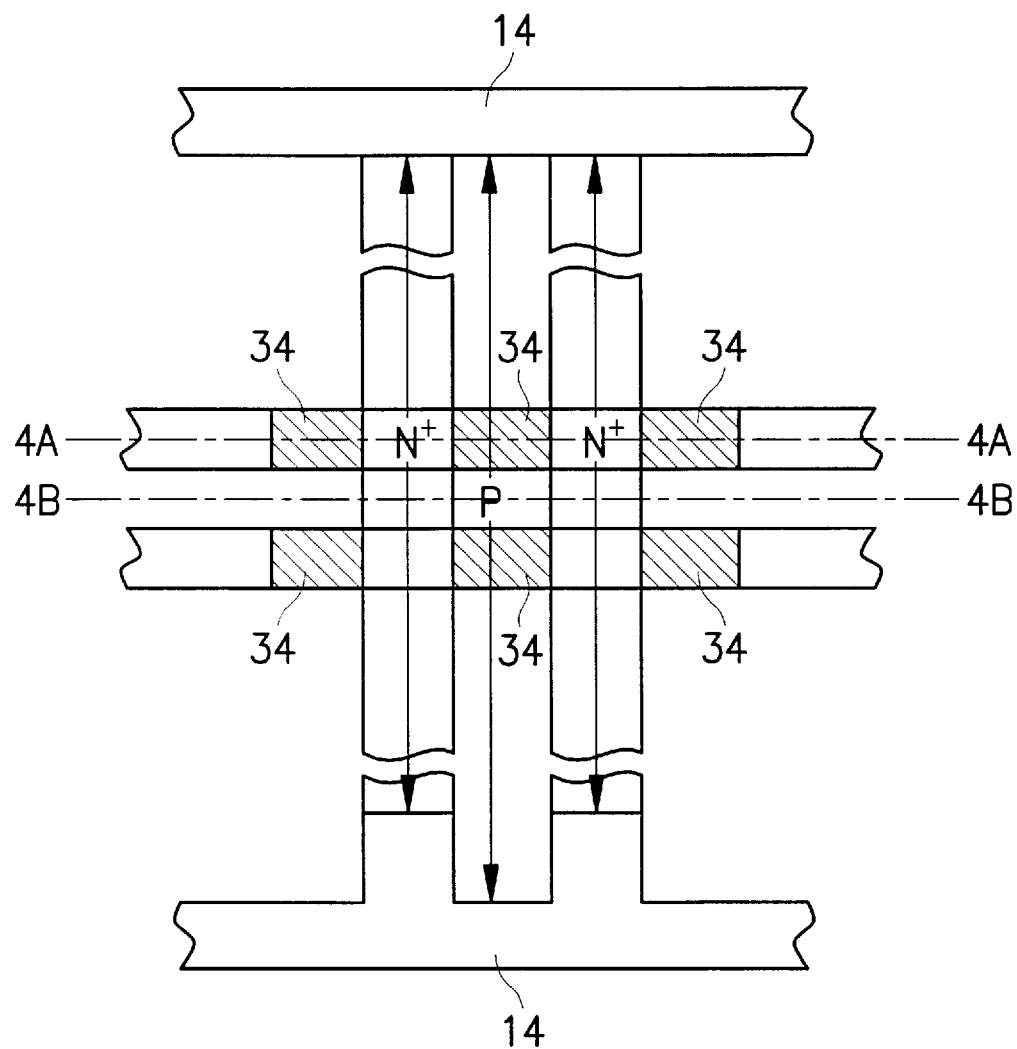
FIG. 4 is the top view of the SOI wafer identifying the locations of the stacked gates.
Figure 4A:
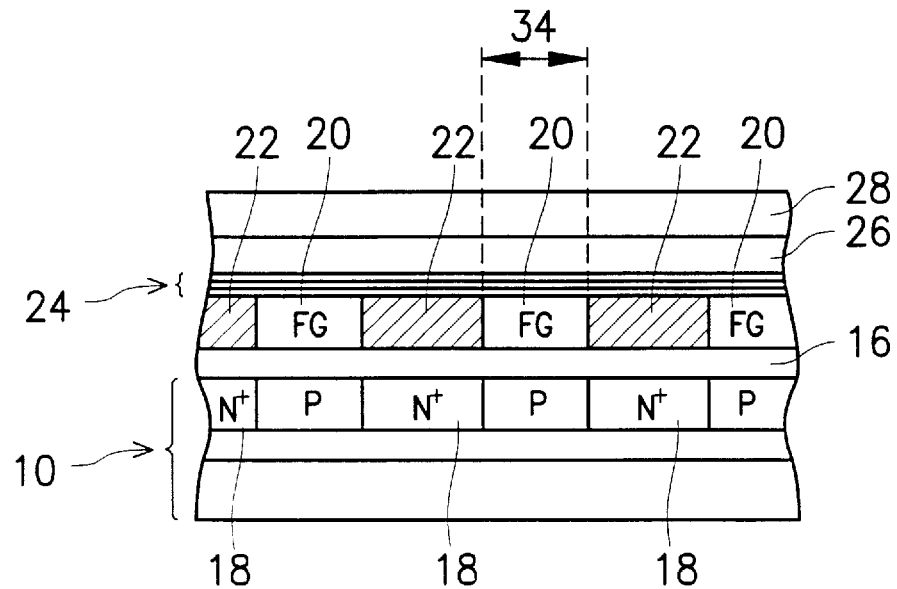
FIGS. 4A and 4B shows for the device configuration on the SOI wafer taken along the 4A—4A and 4B—4B lines respectively in FIG. 4.

As is seen in FIG. 4A, an ONO layer 24 with a thickness of about 100 to 150 Å is formed by means of, for example, first reoxidizing the first polysilicon layers 20 shown in FIG. 3B, followed by the deposition of a nitride layer having a thickness of about 50 to 100 Å, and then reoxidizing the deposited nitride subsequently to form the top oxide layer having a thickness of about 50 to 100 Å for the ONO configuration 24. A second polysilicon layer having a thickness of about 1,500 Å is then deposited atop the ONO configuration 24 with arsenic in-situ doping achieving a dose of about $5E15/cm^2$. This results in an $n^+$ second polysilicon layer 26 as shown in the drawing. Then, a $WSi_x$ layer 28 is formed further atop in order to reduce the resistance of the $n^+$ second polysilicon layer 26. Note that the cross-sectional view of FIG. 4A is taken along the 4A—4A line in the top view FIG. 4 for the device configuration on the SOI wafer up to this stage. This cross-cutting reveals the stacked gates 34 (FIG. 4) for the memory cells in the flash array region 12 (FIG. 1).

Step 5

Stacked gates for the flash array are formed by patterning into the $WSi_x$, second polysilicon and oxide-nitride-oxide layers.

Figure 4B:
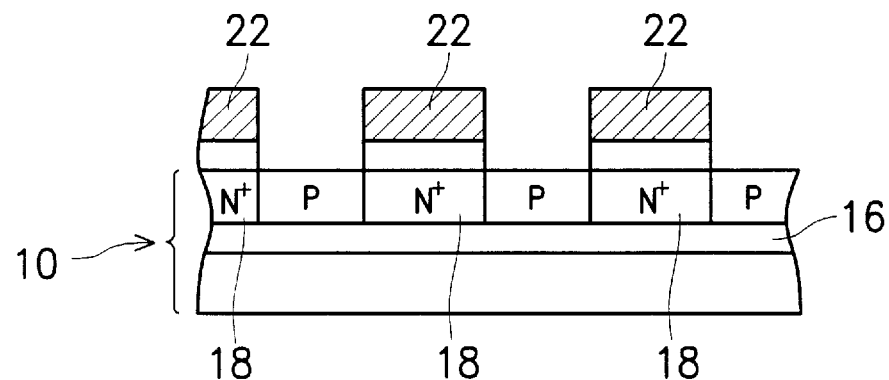

Stacked gates are then defined by, for example, plasma etching to remove unwanted portions of the $WSi_x$, second polysilicon, ONO and first polysilicon layers 28, 26, 24 and 20 respectively, followed by a reoxidation procedure at the temperature of about 900° to 950° C. to seal the stacked gate with an oxide layer having a thickness of 100 to 200 Å (not shown in the drawing). The sealing of the formed stacked gates facilitates the securing of device reliability in terms of reduced leakage current between floating gates and other regions. FIG. 4B is the cross-sectional view taken along the 4B—4B line in FIG. 4 that shows the SOI wafer configuration up to this fabrication stage. As is seen in FIG. 4B, all the $WSi_x$, second polysilicon, ONO and first polysilicon layers 28, 26, 24 and 20 respectively that are not relevant to the areas defined by stacked gates 34 have all been removed in the plasma etching procedure described above, and the BPSG layers 22 are directly exposed.

Step 6

Stacked gates are covered with a second BPSG layer.

A BPSG layer 30 shown in FIG. 5A with thickness of about 10,000 to 14,000 Å is then deposited to cover stacked gates completely which is subsequently reflown and etched back to achieve planarity. Each of the formed BPSG layers that covers the corresponding stacked gates has a thickness of about 8,000 to 12,000 Å that stacks atop the corresponding WSi$_x$ layers 28 (FIG. 4A).

Step 7

Contact openings for the source/drain buried lines and n$^+$ second polysilicon word lines are formed.

Figure 5:
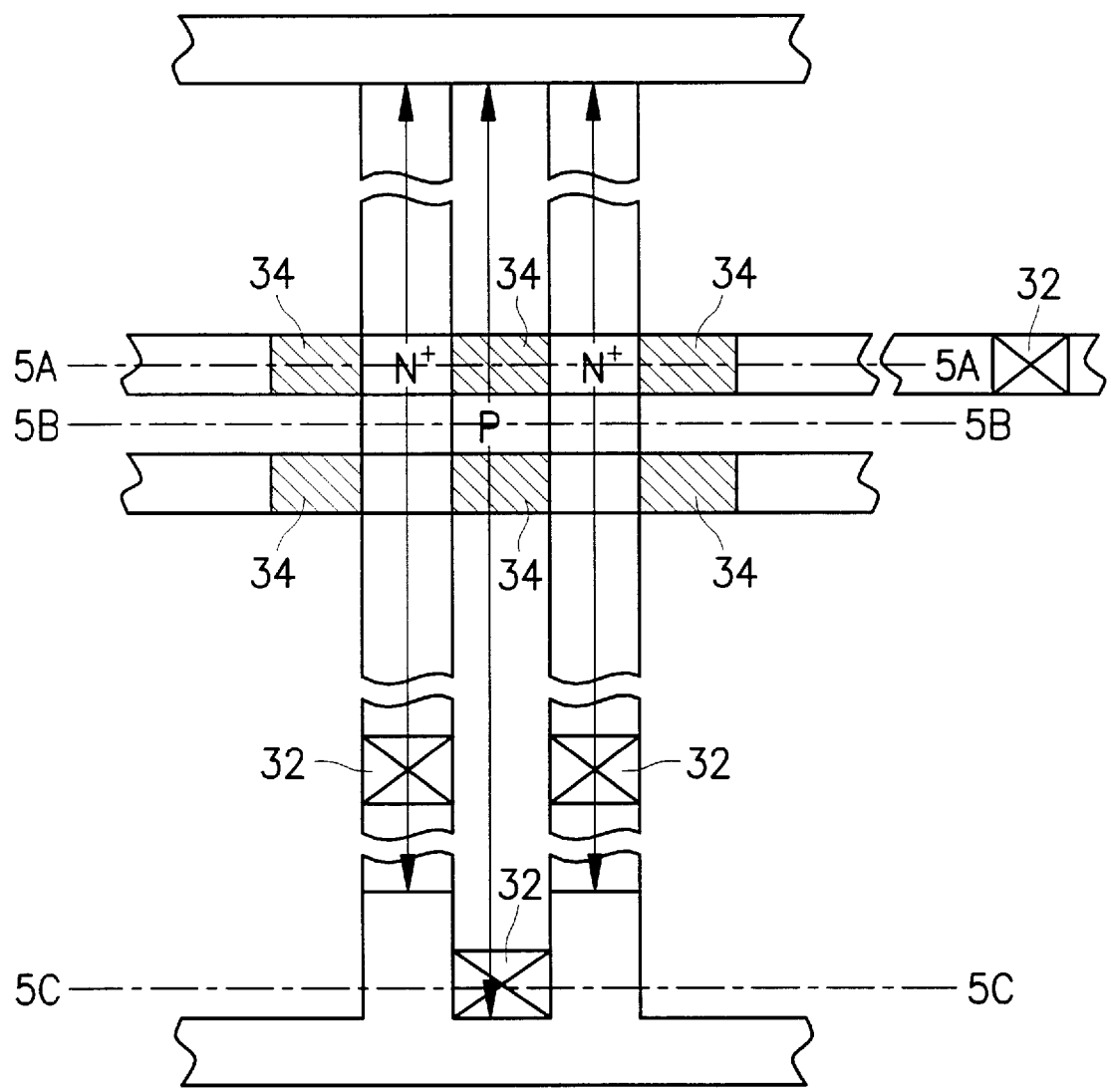
FIG. 5 schematically shows the top view of the SOI wafer having a completely fabricated flash array for the device of the present invention.

FIG. 5 schematically shows the top view of the SOI wafer having a completely fabricated flash array for the device of the present invention. As is seen in FIG. 5, contact openings 32 for n$^+$ source/drain buried-lines are then opened by etching for, for example, every 16 or more flash cells, meanwhile, contact opening 32 for every n$^+$ second polysilicon word lines are performed simultaneously. Thus the subsequently low resistive metal 36 shown in FIG. 5A can efficiently reduce the resistance of n$^+$ buries source/drain diffusion lines by connection of both parallelly. Here the low resistance enhances the read current of flash cells and thereby improves read speed. On the other hand, body lines may have their contact openings 32 opened around the flash memory arrays.

Step 8

Metal lines leading into the contact openings are formed for interconnecting the memory cells in the flash array with relevant peripheral control circuits.

Metal lines 36 may then be defined to interconnect the device memory cells with peripheral control circuit via the contact openings 32 as shown in FIG. 5. And, finally, the devices may be protected by passivation 38 shown in FIG. 5A. Note that in FIG. 5, hatches are employed to show the locations the stacked gates 34.

Step 8 generally concludes the process for the fabrication of the compact contactless flash array for EEPROM semiconductor devices in accordance with the preferred embodiment of the present invention. To describe the structural configuration of the compact contactless flash array of the present invention in further detail, three cross sectional views FIGS. 5A, 5B and 5C are taken along the 5A—5A, 5B—5B and 5C—5C lines respectively in the top view of the fabricated SOI wafer shown in FIG. 5. These three depicted cross-sectional views, which include the cross sections of the stacked gates, the region between consecutive stacked gates, and the field oxide at the periphery of the flash array region, are helpful in the understanding of the characteristics of the structural configuration of the flash array of the present invention, as well as the functional characteristics it can achieve.

Figure 5A:
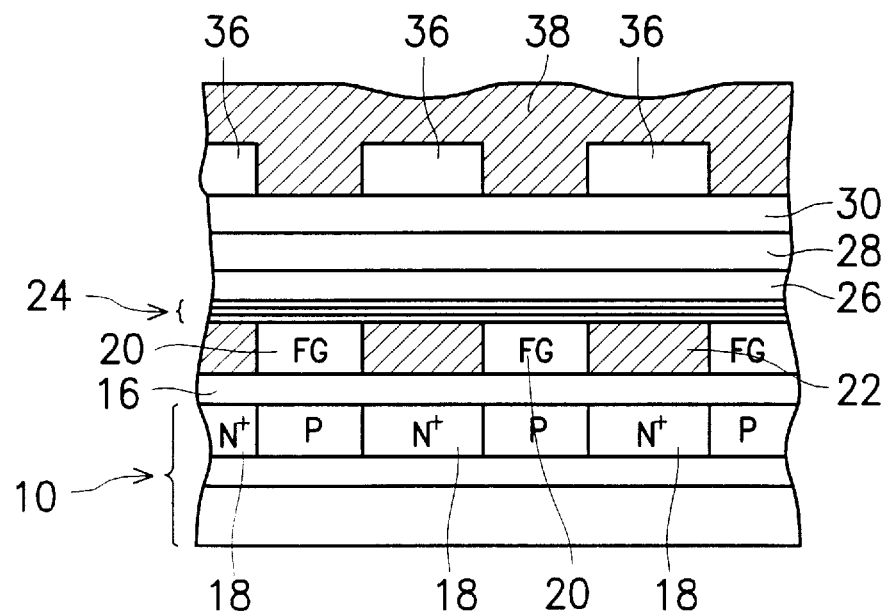
FIGS. 5A, 5B and 5C are cross-sectional views taken along the 5A—5A, 5B—5B and 5C—5C lines respectively in the top view of the fabricated SOI wafer shown in FIG. 5.
Figure 5B:
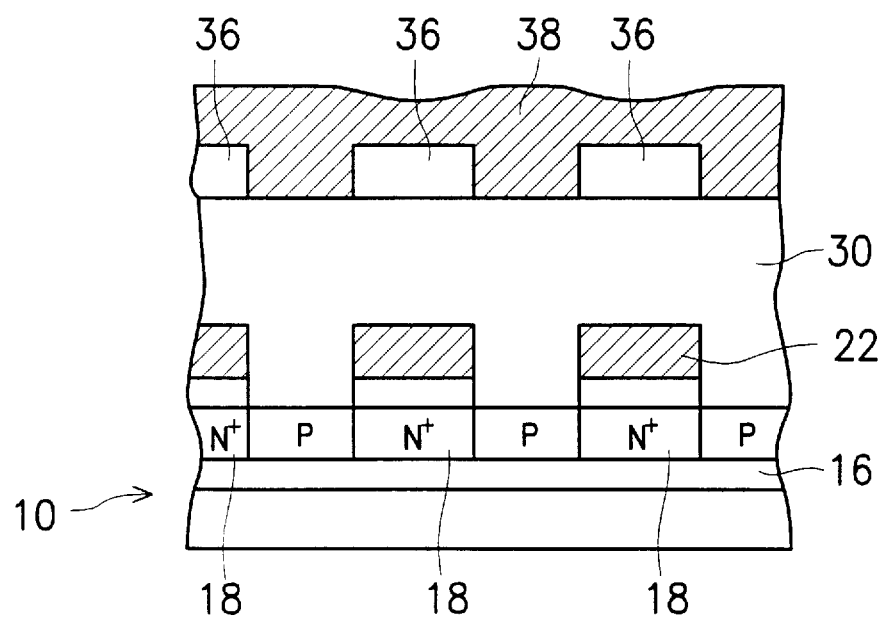
Figure 5C:
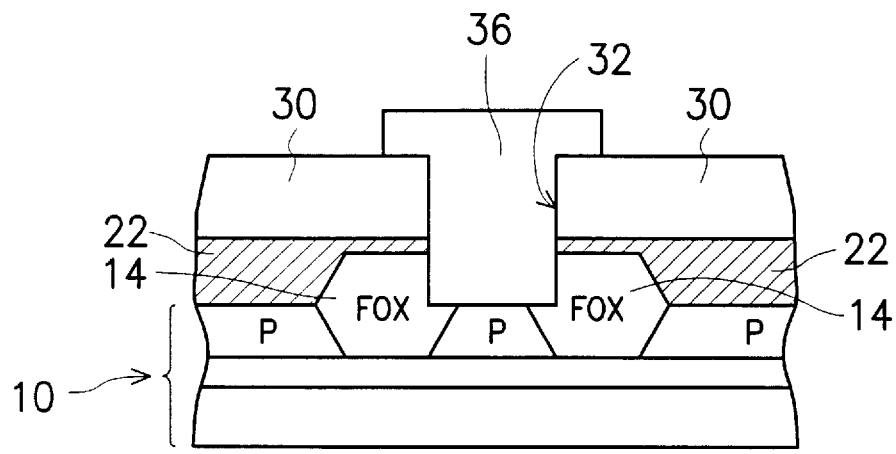
Figure 6:
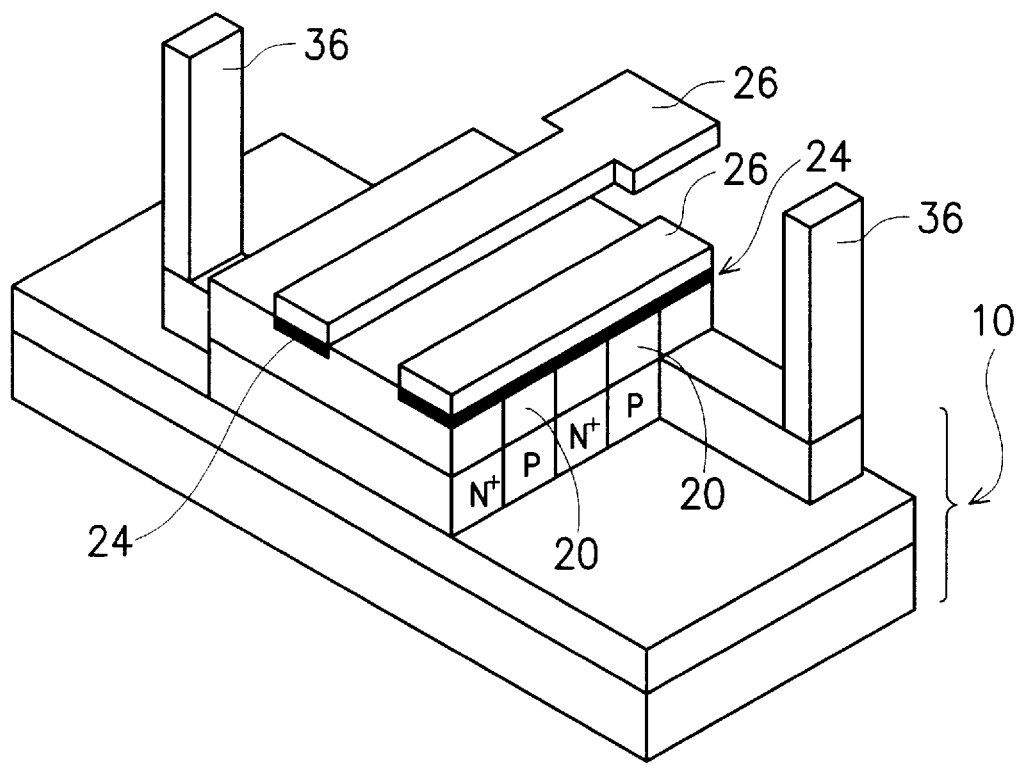
FIG. 6 is a perspective view of the fabricated flash array of the present invention showing the spatial characteristics of the device's structural configuration.

In addition to the cross-sectional views FIGS. 5A, 5B and 5C, a perspective view of the fabricated flash array of the present invention is also shown in FIG. 6 to further demonstrate the spatial characteristics of the device's structural configuration. Simultaneous reference to the drawings of FIG. 5, FIGS. 5A, 5B and 5C and FIG. 6 will help identify the relative spatial relationships of the components for the construction of the flash array of the present invention.

Figure 7A:
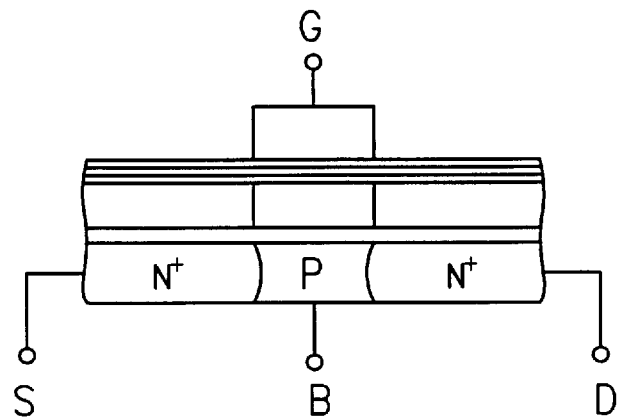
FIG. 7A schematically shows the structural configuration of one memory cell unit of the flash array of the present invention.
Figure 7B:
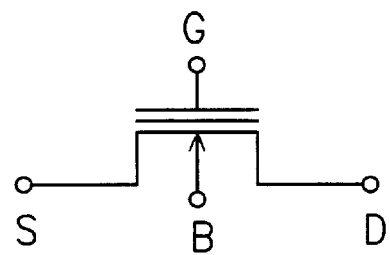
FIG. 7B shows the corresponding equivalent circuit symbol of the memory cell unit of the flash array of FIG. 7A.

FIG. 7A of the drawing schematically shows the structural configuration of one memory cell unit of the flash array of the present invention, while FIG. 7B shows the corresponding equivalent circuit symbol thereof. As is seen in FIGS. 7A and 7B, each of the fabricated memory cell unit includes a pair of n$^+$ source/drain buried lines S and D respectively, a body line B, and a stacked gate G that generally includes a first polysilicon layer, an ONO configuration and a second polysilicon layer. The pair of n$^+$ source/drain buried lines sandwiches the body line B, and the stacked gate G directly sits atop the body line B.

Figure 8:
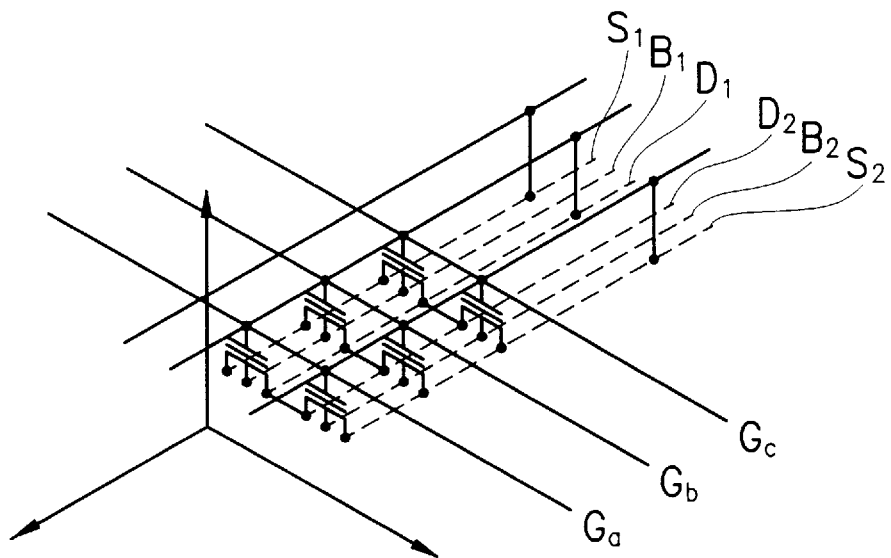
FIG. 8 schematically shows, in perspective manner, the connection of a group of memory cell units arranged in a portion of the flash array of the device of the present invention.

FIG. 8 schematically shows, in perspective manner, the connection of a group of memory cell units arranged in a portion of the flash array of the device of the present invention. In the drawing, circuit symbol of FIG. 7B has been employed to schematically exemplify the configuration of an array of memory cell units for the present invention. As is seen, a set of memory cell units may be cascaded in a row (or column) that have their stacked gates G all tied together and triggered by a word line signal G$_a$ (or, G$_b$ or G$_c$). Similarly, another set of memory cell units may be cascaded in a column (or row) that have their sources/drains S and D, as well as body lines B tied together respectively and be controlled by the body line signal B1 (or B2). In the arrangement shown in FIG. 8, each row (or column) of the memory cell units in the array may be directly addressed in either the read, erase or program mode via the selection of the attached metal line, such as the one exemplified by metal I that controls the body line B1 (or B2) and the word line G$_a$ (or G$_b$ or G$_c$).

Thus, in the flash array configuration of the present invention, each of the compact cells may share its source/drain with adjacent cells. The body lines isolated by source/drain lines allow for the flash memory cells of the present invention to make use of the FN (Fowler-Nordheim) tunneling effect between the floating gate and the substrate to implement both the programming and erasing operation. Due to the use of SOI wafer, the substrate portion of each of the adjacent cells is isolated by source and drain. By setting the voltage difference between substrate and gate, cell programming and erase can be performed, as is exemplified in the table below.

In terms of the applied electric potential at the control terminals of each of the memory cell units, Table 1 below lists such a control scheme for the read, erase and program of selected number of memory cells, assuming the activation of word line G$_a$ and body line B$_1$ in the array of FIG. 8.

TABLE 1

| Single cell Operation | Program | Erase | Read |
| --- | --- | --- | --- |
| G$_a$ | V$_{ppt}$ (13 V) | V$_{BB2}$ (−13 V) | V$_{CG}$ (5 V) |
| S$_1$ | 0 V | Floating | 0 v |
| B$_1$ | V$_{BB1}$ (−7 V) | 7 V | 0 V |
| D$_1$ = D$_2$ | 0 V | Floating | V$_D$ (1 V) |
| B$_2$ | 0 V | 0 V | 0 V |
| S$_2$ | 0 V | 0 V | 0 V |
| G$_b$/G$_c$ | 0 V | 0 V | 0 V |

When compared to the flash array of the prior art, the present invention is advantageously distinguishable in that the body line of the memory cell units of the present invention is being isolated by the surrounding buried n$^+$ source/drain lines and the SiO$_2$ layer of the SOI wafer. This allows the memory cells of the flash array of the present invention to be erased and programmed utilizing the body line and word line in an FN (Fowler-Nordheim) tunneling effect.

A majority of prior flash array memory cell configurations, on the other hand, would have to rely on the drain, source and word line thereof in a hot carrier transport mode to implement the memory cell programming. In the continuous trend of device dimensional scaling down for the improvement of memory density, the short channel effect that is inevitable in the prior art devices which rely on hot carrier program/erase operations constitutes a serious drawback when compared to the characteristics of the flash array of the present invention.

While the present invention has been described by way of example and in terms of preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating compact contactless flash memory array for semiconductor EEPROM device, comprising:

(a) growing field oxide layers for said flash memory array over a surface of a silicon-on-insulator wafer;

(b) growing a gate oxide layer on the wafer, forming floating gates over the wafer, and forming source/drain buried bitlines for said flash memory array;

(c) depositing a first BPSG (borophosphosilicate glass) layer on the gate oxide layer, and then reflowing and etching back;

(d) forming an oxide-nitride-oxide layer on the first BPSG layer, depositing a polysilicon layer with in-situ dope over the oxide-nitride-oxide layer to form $n^+$ polysilicon word lines, and then forming a $WSi_x$ layer over the polysilicon layer;

(e) forming stacked gates for said flash memory array by patterning into said formed $WSi_x$, polysilicon and oxide-nitride-oxide layers;

(f) covering said stacked gates with a second BPSG layer;

(g) forming contact openings for said source/drain buried bitlines and $n^+$ polysilicon word lines; and (h) forming metal lines leading into said contact openings for interconnecting memory cells in said flash memory array with peripheral control circuits of said semiconductor EEPROM devices.

2. The process for fabricating compact contactless flash memory array for semiconductor EEPROM devices of claim 1, wherein the growing field oxide layer includes first growing a layer of pad oxide with a thickness of about 200 to 400 Å over the surface of said silicon-on-insulator wafer, depositing a nitride layer having a thickness of about 500 to 1,000 Å;

patterning said nitride layer; and growing said field oxide layers having a thickness of about 4,000 to 5,000 Å under a temperature of about 900° to 950° C. utilizing said patterned nitride layer as a shielding mask.

3. The process of fabricating compact contactless flash memory array for semiconductor EEPROM devices of claim 1, wherein the growing gate oxide layer, forming floating gates, and forming source/drain buried bitlines includes:

growing said gate oxide layer to have a thickness of about 60 to 100 Å;

forming said source/drain buried bitlines by depositing a first polysilicon layer with a thickness of about 1,500 Å;

patterning said first polysilicon layer followed by arsenic implantation at an energy level of about 25 KeV, achieving a dose of about $3E15/cm^2$ to form $n^+$ type of said source/drain buried bitlines; and reoxidizing a surface of said first polysilicon layer at a temperature of about 900° to 950° C. to provide a layer of oxide having a thickness of about 100 to 200 Å.

4. The process for fabricating compact contactless flash memory array for semiconductor EEPROM devices of claim 1, wherein the depositing a first BPSG layer and then reflowing and etching back includes:

depositing said first BPSG layer to have a thickness of about 5,000 to 8,000 Å in a low temperature oxide (LTO) deposition procedure for covering said first polysilicon layer completely; and reflowing said first BPSG layer to achieve planarity and etching back until said first polysilicon layer is exposed.

5. The process for fabricating compact contactless flash memory array for semiconductor EEPROM devices of claim 1, wherein the forming an oxide-nitride-oxide layer, depositing a polysilicon layer with in-situ dope, and then forming a $WSi_x$ layer includes:

forming said oxide-nitride-oxide layer to have a thickness of about 100 to 150 Å by first reoxidizing a first polysilicon layer, followed by depositing a nitride layer having a thickness of about 50 to 100 Å, and then reoxidizing said deposited nitride layer to form a top oxide layer having a thickness of about 50 to 100 Å; and forming said second polysilicon layer to have a thickness of about 1,500 Å by depositing over said oxide-nitride-oxide layer with arsenic in-situ doping achieving a dose of about $5E15/cm^2$ to form an $n^+$ second polysilicon layer.

6. The process for fabricating compact contactless flash memory array for semiconductor EEPROM devices of claim 1, wherein the forming stacked gates includes:

defining with plasma etching to remove unwanted portions of said $Wsi_x$ layer, the polysilicon layer, the oxide-nitride-oxide layer and a first polysilicon layer, and performing a reoxidation procedure at a temperature of about 900° to 950° C. for sealing said stacked gates.

7. The process for fabricating compact contactless flash memory array for semiconductor EEPROM devices of claim 1, wherein the covering said stacked gates with a second BPSG layer includes first depositing a BPSG layer having a thickness of about 10,000 to 14,000 Å and reflowing and etching back the BPSG layer to achieve planarity and have a thickness of about 8,000 to 12,000 Å.

8. The process for fabricating compact contactless flash memory array for semiconductor EEPROM devices of claim 1 wherein said source/drain buried bitlines are in $n^+$ source/drain buried bitlines and, wherein the forming contact openings includes etching for every 16 or more of said memory cells for $n^+$ source/drain buried bit lines, opening said contact openings around said flash memory arrays for body lines, and opening said contact openings for every said $n^+$ polysilicon word lines.

9. The process for fabricating compact contactless flash memory array for semiconductor EEPROM devices of claim 1, wherein the forming metal lines includes leading the metal lines into said contact openings for interconnecting the memory cells in said flash memory array with peripheral circuits of said semiconductor EEPROM devices.

10. The process for fabricating compact contactless flash memory array for semiconductor EEPROM devices of claim 1, further comprising protecting said flash memory array by passivation.

* * * * *